United States Patent
Hwang et al.

(10) Patent No.: US 7,420,431 B2
(45) Date of Patent: Sep. 2, 2008

(54) RC OSCILLATOR INTEGRATED CIRCUIT INCLUDING CAPACITOR

(75) Inventors: Jong-Tae Hwang, Seoul (KR); Dae-Ho Kim, Seoul (KR); Moon-Sang Jung, Seoul (KR); Dong-Hwan Kim, Gyeonggi-do (KR)

(73) Assignee: Fairchild Korea Semiconductor, Ltd., Bucheon-si (KR)

(*) Notice: Subject to any disclaimer, the term of this patent is extended or adjusted under 35 U.S.C. 154(b) by 87 days.

(21) Appl. No.: 11/607,357

(22) Filed: Dec. 1, 2006

(65) Prior Publication Data

US 2007/0146087 A1  Jun. 28, 2007

(30) Foreign Application Priority Data

Dec. 2, 2005  (KR)  ...................... 10-2005-0117246

(51) Int. Cl.
*H03K 3/02*  (2006.01)
(52) U.S. Cl. .................. 331/143; 331/144; 331/111; 331/113 R
(58) Field of Classification Search ........... 331/143, 331/144, 111, 113 R
See application file for complete search history.

(56) References Cited

U.S. PATENT DOCUMENTS

| | | | | |
|---|---|---|---|---|
| 4,714,901 | A  * | 12/1987 | Jain et al. | .............. 331/176 |
| 6,680,656 | B2 * | 1/2004 | Chen | .............. 331/143 |
| 6,873,216 | B2 * | 3/2005 | Seya | .............. 331/74 |
| 6,917,249 | B1 | 7/2005 | Kuo et al. | |
| 2006/0181360 | A1 * | 8/2006 | Mirow | .............. 331/144 |

* cited by examiner

*Primary Examiner*—Joseph Chang
(74) *Attorney, Agent, or Firm*—Sidley Austin LLP

(57) ABSTRACT

An RC oscillator integrated circuit includes: an active current mirror connected to an external resistor, for receiving a current signal corresponding to a voltage signal applied to the external resistor, performing 1/N-times division of the received current signal according to an input clock signal, and generating a 1/N-times current signal; an oscillation circuit for generating an output voltage corresponding to a charging- or discharging-operation of a capacitor via a current path formed by the active current mirror; a feedback switching circuit for controlling a charging- or discharging-path of the capacitor by a feedback of an output signal Vo of the oscillation circuit; and a divider for generating not only a first clock signal capable of driving the active current mirror according to the output signal of the oscillation circuit, but also a second output clock signal having a compensated mismatch of the active current mirror.

7 Claims, 9 Drawing Sheets

RC OSCILLATOR INTEGRATED CIRCUIT INCLUDING CAPACITOR

CROSS-REFERENCE TO RELATED PATENT APPLICATIONS

This application claims the benefit of Korean Patent Application No. 10-2005-117246, filed on Dec. 2, 2005, in the Korean Intellectual Property Office, the disclosure of which is incorporated herein in its entirety by reference.

BACKGROUND OF THE INVENTION

1. Field of the Invention

The present invention relates to an oscillator integrated circuit (IC), and more particularly to an RC oscillator IC including a capacitor.

2. Description of the Related Art

FIG. 1 is a circuit diagram illustrating a conventional saw-tooth oscillator (also called a triangular oscillator). Conventional saw-tooth oscillators include first and second transistors M1 and M2, a capacitor CT, first and second comparators COMP1 and COMP2, and an RS flip-flop SR LATCH. The RS flip-flop includes an output terminal Q, such that the Q output terminal generates a saw-tooth wave signal as an output voltage Vo. If the output voltage Vo assumes a low level, the first transistor M1 is switched on, and the capacitor CT is charged with a first current I1. If the capacitor-voltage VCT is higher than a threshold voltage VT, the RS flip-flop (SR LATCH) is set so that the output voltage Vo assumes a high level. If the output voltage Vo is high, the first transistor M1 is switched off, and the second transistor M2 is switched on, such that the capacitor CT is discharged to a second current I2.

If the capacitor-voltage VCT is less than the reference voltage VB, the output signal of the second comparator COMP2 assumes a high level, such that the RS flip-flop SR LATCH is reset, and the output voltage Vo assumes a low level. If the output voltage Vo assumes a low level, the above-mentioned operation is repeated, resulting in an oscillation. Provided that the first current I1 and the second current I2 is approximately constant I, an oscillation period T can be represented by the following Equation 1, and an oscillation frequency f can be represented by the following equation 2:

$$T = 2\frac{CT(VT - VB)}{I} \quad \text{[Equation 1]}$$

$$f = \frac{I}{2sCT(VT - VB)} \quad \text{[Equation 2]}$$

Here "CT" is indicative of the capacitance of the capacitor CT. The above-mentioned saw-tooth oscillator may determine the first current I1 and the second current I2 using resistors, respectively. In this case, the oscillation frequency f is changed according to the resistance of the resistors. Oscillators containing a resistor and a capacitor are referred to as RC oscillators.

FIG. 2 is a circuit diagram illustrating a conventional RC oscillator. Conventional RC oscillators include first and second transistors M1 and M2, a capacitor CT, first and second comparators COMP1 and COMP2, a RS flip-flop SR LATCH, a first current mirror 110, a second current mirror 120, and a voltage/current converter 130. The first transistor M1 is connected to a second output terminal OUT2 of the first current mirror 110. A first output terminal OUT1 of the first current mirror 110 is connected to an input terminal IN of the second current mirror 120. The second transistor M2 is connected to an output terminal OUT of the second current mirror 120. The input terminal IN of the first current mirror 110 is connected to an external resistor RT via the voltage/current converter 130. In the above-mentioned configuration, a voltage signal applied to the resistor RT is indicative of a reference voltage VREF, and a current signal IRT applied to the resistor RT assumes the value of VREF/RT, the voltage VREF divided by the resistance of RT.

FIG. 3 is a circuit diagram illustrating an example of the current mirror of FIG. 2. If the first transistor M1 has the same characteristics as the second transistor M2, the ratio of the input current IN to the output current IO will be 1:1. However, typically the first transistor M1 has different characteristics than the second transistor M2. Due to this mismatch of the characteristics between the first and second transistors M1 and M2, the relationship, or ratio, between the input current and the output current will be 1:(1+A). Here A indicates the degree of mismatch, and is typically close to 0.

FIGS. 4-6 illustrate the layout and the operation of an active current mirror. A plurality of switches SW1-SW6 are arranged to solve the above-mentioned mismatch problem of FIG. 3. The switches SW1-SW6 perform a switching operation timed by a clock signal CLK or an inverse clock signal $\overline{CLK}$.

The active current mirror is able to minimize the degree of the mismatch between the first transistor M1 and the second transistor M2 by the switching operation of the switches SW1-SW6. If the clock signal CLK assumes a high level, the switches are configured to implement the equivalent circuit of FIG. 5. The equivalent circuit of FIG. 5 operates in the same manner as in FIG. 3, and the output current IO can be represented by the following Equation 3:

$$IO = (1+A) \cdot IN \quad \text{[Equation 3]}$$

On the other hand, if the clock signal CLK assumes a low level, the inverse clock signal $\overline{CLK}$ assumes a high level, the switches SW2, SW5, and SW6 are switched on, to be configured as the equivalent circuit of FIG. 6. In this case, the output current IO can be represented by the following Equation 4:

$$IO = \frac{IN}{1+A} \quad \text{[Equation 4]}$$

Provided that the clock signal CLK assumes the high and low levels for the same length of time, leading to a duty of essentially 50%, the output current IO will assume the value of Equation 3 and Equation 4 for the same length of time. Therefore, the average output current IO(AVG) can be represented by the following Equation 5:

$$IO(AVG) = \left(1 + A + \frac{1}{1+A}\right) \cdot \frac{IN}{2} \quad \text{[Equation 5]}$$

$$\approx (1 + A + 1 - A + A^2) \cdot \frac{IN}{2}$$

$$= \left(1 + \frac{A^2}{2}\right) IN$$

As can be seen from Equation 5, the current output signal of the current mirror depends on the square of the mismatch A. For example, if the mismatch A equals 0.1, representing a 10% mismatch, the average output current IO(AVG) of the current mirror will change only by $(0.1)^2/2=0.005$. This implementation lowers the influence of the mismatch on IO(AVG) considerably.

However, in order to operate the current mirror in the above manner, the duty of the clock signal needs to be maintained at 50% with high precision. This is not an easy task, as the conventional current mirrors do not receive external clock signals.

If a user desires to include a capacitor in an oscillator IC, the area covered by the capacitor must be minimized to improve an integration degree of the IC. For this reason, implementing the capacitor CT with high capacitance is not easy. A low capacitance for capacitor CT, however, leads to an undesirably high frequency.

Capacitor CT is charged or discharged with the current IRT. To address the above high frequency problem, the input current IRT is multiplied by 1/N using the current mirror of FIG. 3 or 4 for the discharging of the capacitor CT. This implementation will make the capacitor CT have the same effect as an N-times larger capacitor.

However, there are problems with the just-described approach. The characteristics-mismatch of elements of the current mirror is such a problem. Also, there may be a mismatch-dispersion, making it impossible to correctly generate a desired current signal lower than that of the apparent N-fold increased capacitor. The higher the current-division ratio N, the higher the degree and dispersion of the mismatch.

SUMMARY OF THE INVENTION

In accordance with the present invention, the above and other objects can be accomplished by a RC oscillator integrated circuit (IC) including: an active current mirror connected to an external resistor, for receiving a current signal corresponding to a voltage signal applied to the external resistor, performing 1/N-times division of the received current signal according to an input clock signal, and generating a 1/N-times current signal; an oscillation circuit for generating an output voltage corresponding to a charging- or discharging-operation of a capacitor via a current path formed by the active current mirror; a feedback switching circuit for controlling a charging- or discharging-path of the capacitor by a feedback of an output signal Vo of the oscillation circuit; and a divider for generating not only a first clock signal capable of driving the active current mirror according to the output signal of the oscillation circuit, but also a second output clock signal having a compensated mismatch of the active current mirror.

The oscillation circuit may include: a first comparator for receiving a voltage of the capacitor at its positive input terminal, and receiving a threshold voltage at its negative input terminal; a second comparator for receiving a reference voltage at its positive terminal, and receiving the capacitor voltage at its negative terminal; and an RS flip-flop for receiving an output signal of the first comparator at its S input terminal, and receiving an output signal of the second comparator at its R input terminal.

The feedback switching circuit may include: a first MOS transistor for receiving the output signal of the oscillation circuit at its gate terminal, connecting its drain terminal to the active current mirror, and receiving the capacitor voltage at its source terminal; and a second MOS transistor for receiving the output signal of the oscillation at its gate terminal, receiving the capacitor voltage at its drain terminal, and connecting its source terminal to the active current mirror.

The active current mirror may include: a first active current mirror including: an input terminal for receiving a current signal corresponding to the voltage applied to the external resistor; a first output terminal; and a second output terminal connected to the drain terminal of the first MOS transistor; and a second active current mirror including: an input terminal connected to the first output terminal of the first active current mirror; and an output terminal connected to the source terminal of the second MOS transistor.

The first active current mirror include: a first current mirror; and a second current mirror for receiving an output current signal of the first current mirror, and generating the received current signal according to the input clock signal.

The second current mirror may include a plurality of second current mirror units arranged in the form of a cascade in which output terminals of front current mirror units are connected to input terminals of rear current mirror units, whereby the second current mirror outputs a ½n-times divided current if the number of the second current mirror units is N.

The divider may include: a first D-flip-flop for receiving the output signal of the oscillation circuit as its clock signal, and receiving a clock signal generated from its Q output terminal via its D input terminal; and a second D-flip-flop for receiving the clock signal generated from the Q output terminal of the first D-flip-flop as a clock signal, and receiving the clock signal generated from its Q output terminal via its D input terminal, whereby the clock signal generated from the first D-flip-flop is used as the clock signal for operating the active current mirror.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION

Figure 1:
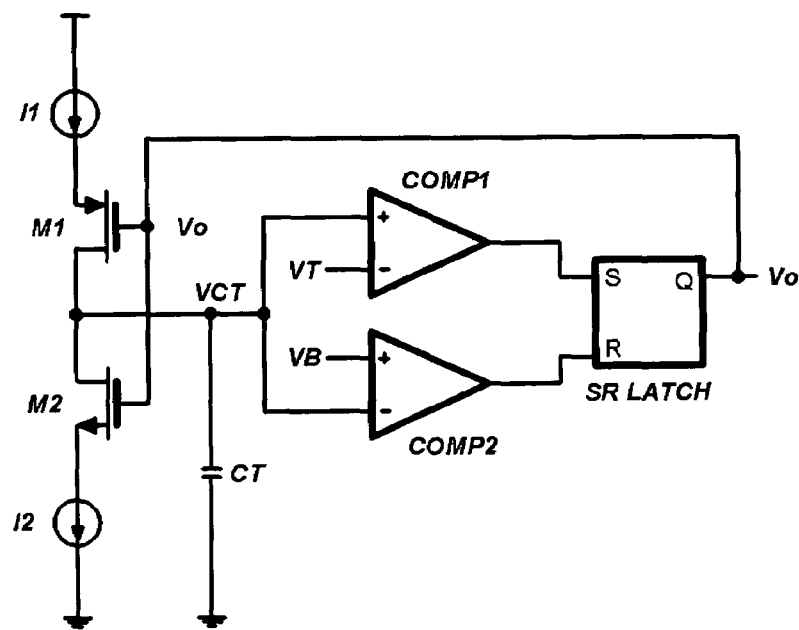
FIG. 1 is a circuit diagram illustrating a conventional sawtooth oscillator.
Figure 2:
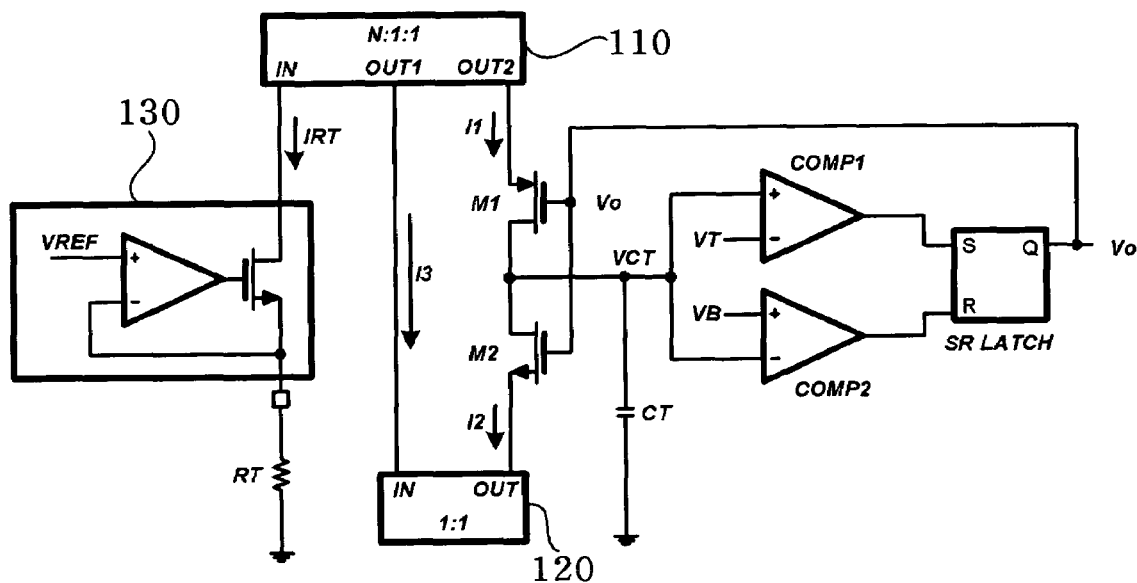
FIG. 2 is a circuit diagram illustrating a conventional RC oscillator.
Figure 3:
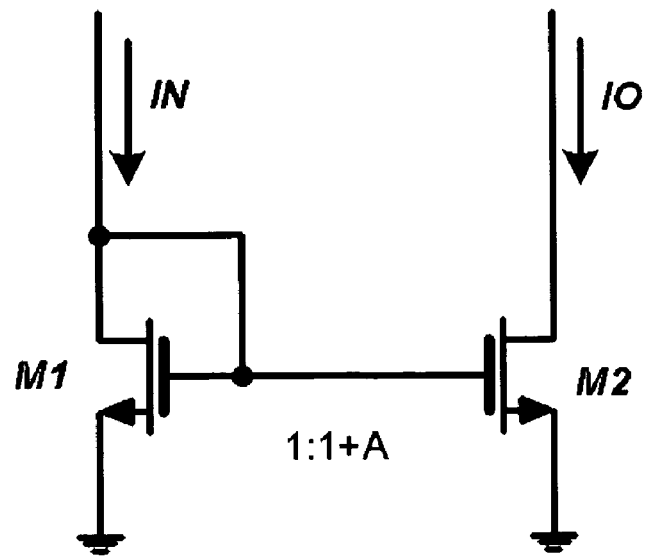
FIG. 3 is a circuit diagram illustrating an example of the current mirror of FIG. 2.
Figure 4:
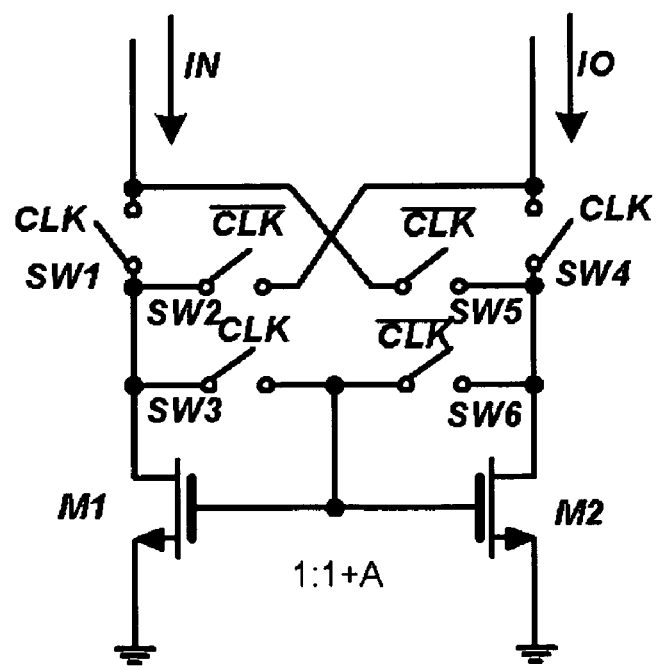
FIG. 4 is a circuit diagram illustrating an example of an active current mirror.
Figure 5:
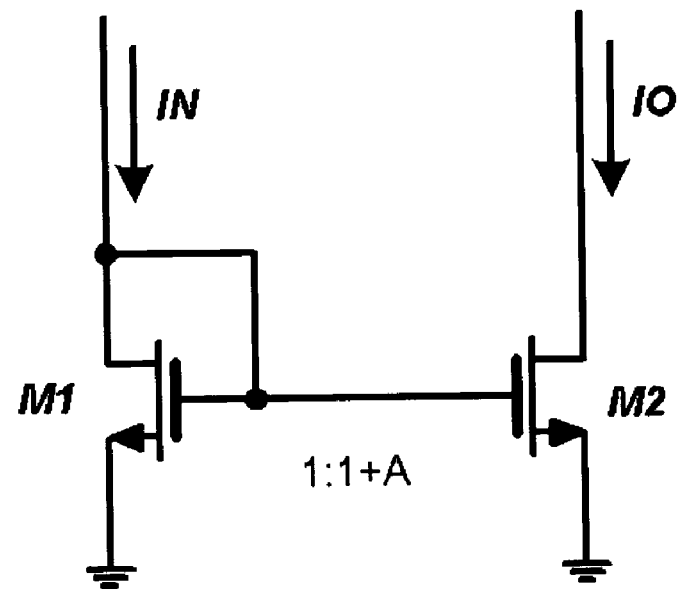
FIGS. 5-6 are circuit diagrams illustrating equivalent circuits of the active current mirror of FIG. 4.
Figure 6:
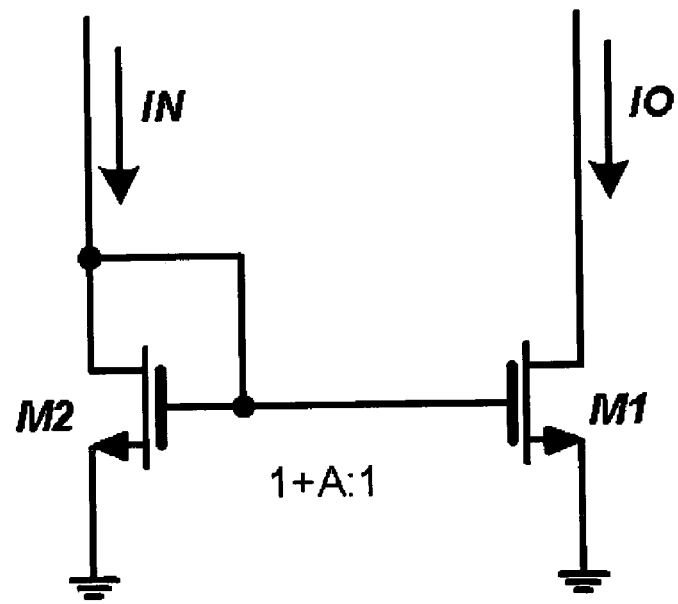

Embodiments of the present invention will be described in detail with reference to the annexed drawings. In the drawings, the same or similar elements are denoted by the same reference numerals. In the following detailed description of known functions and configurations incorporated herein will be omitted for clarity.

Figure 7:
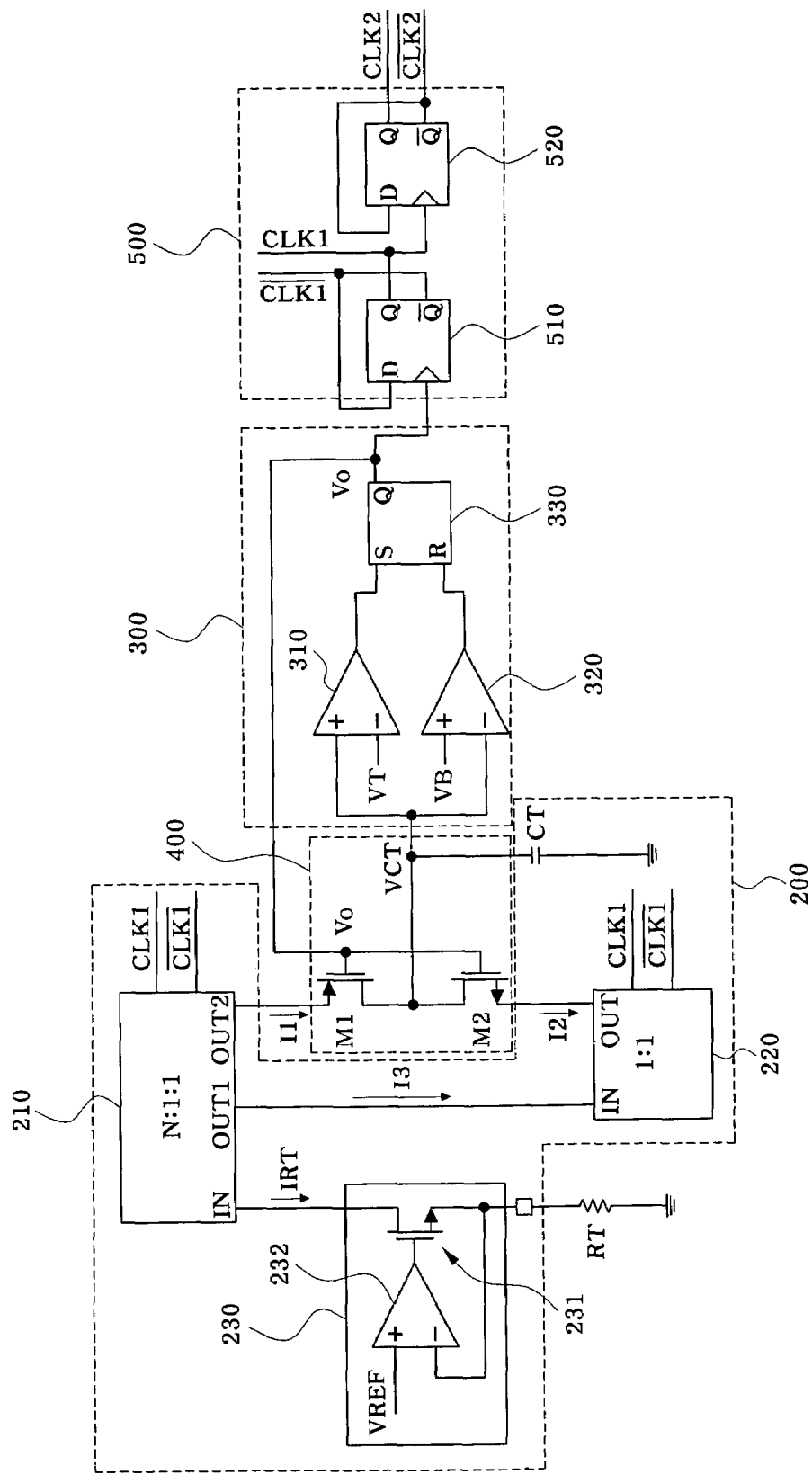
FIG. 7 is a circuit diagram illustrating an RC oscillator IC including a capacitor according to the present invention.

FIG. 7 is a circuit diagram illustrating an RC oscillator IC including a capacitor according to the present invention. The RC oscillator IC may include an active current mirror 200, an oscillation circuit 300, a feedback switching circuit 400, and a divider 500.

The active current mirror 200 is connected to an external resistor RT, receives a current signal IRT corresponding to a voltage signal applied to the resistor RT, performs 1/N-times division of the received current signal IRT according to an input clock signal CLK1, and outputs a 1/N-times current signal I1.

The oscillation circuit 300 generates an output voltage VCT corresponding to a charging- or discharging-operation of a capacitor CT via a current path formed by the active current mirror 200.

The feedback switching circuit 400 controls a charging- or discharging-path of the capacitor CT by a feedback of an output signal Vo of the oscillation circuit 300.

The divider 500 generates not only a first clock signal CLK1 for driving the active current mirror 200 according to the output signal Vo of the oscillation circuit 300, but also a second output clock signal CLK2 having a compensated mismatch of the active current mirror 200.

In more detail, the active current mirror 200 includes a first active current mirror 210 and a second active current mirror 220. The first active current mirror 210 performs 1/N-times division of the current signal IRT corresponding to the voltage applied to the resistor RT, and generates 1/N-times current signals I1 and I3. The second active current mirror 220 provides a discharging path of the capacitor CT according to the input clock signal CLK1. A voltage/current converter 230 is located between the first active current mirror 210 and the external resistor RT.

The voltage/current converter 230 includes a transistor 231 and an operational amplifier (OP-amp) 232. A drain terminal of the transistor 231 is connected to the first active current mirror 210, and a source terminal of the transistor 231 is connected in series to the external resistor RT. The OP-amp 232 receives a reference voltage VREF at a positive terminal. A negative terminal of OP-amp 232 is connected to the source terminal of the transistor 231, and an output terminal is connected to a gate terminal of the transistor 231.

The voltage/current converter 230 applies a voltage to the resistor RT, equal to the reference voltage VREF, such that the input current IRT received in the first active current mirror 210 is equal to VREF/RT. Here, RT indicates the resistance of the resistor RT.

The first active current mirror 210 includes a single input terminal IN and two output terminals OUT1 and OUT2. The input terminal IN is connected to the voltage/current converter 230, the first output terminal OUT1 is connected to the input terminal IN of the second active current mirror 220, and the second output terminal OUT2 is connected to the feedback switching circuit 400. In addition, the second active current mirror 220 includes a clock input terminal for receiving the clock signal CLK generated by the divider 500. The ratio of the input current IRT received at the input terminal IN, the current signal I3 at the first output terminal OUT1, and the current signal I1 at the second output terminal OUT2 is denoted by N:1:1.

The second active current mirror 220 includes an input terminal IN and an output terminal OUT. The input terminal IN is connected to the first output terminal OUT1 of the first active current mirror 210, and the output terminal OUT is connected to the feedback switching circuit 400. In addition, the second active current mirror 220 includes a clock input terminal for receiving the clock signal CLK generated by the divider 500. The ratio of the input current I3 received at the input terminal IN to the current signal I2 at the output terminal OUT is denoted by 1:1.

The oscillation circuit 300 includes a first comparator 310, a second comparator 320, and a latch circuit 330. The first comparator 310 receives a voltage VCT, varying with the charging- or discharging-operation of the capacitor CT, at a positive terminal, and receives a threshold voltage VT at a negative terminal. The second comparator 320 receives the reference voltage VB at a positive terminal, and receives the voltage VCT at a negative terminal. The first comparator 310 and the second comparator 320 can be configured as an OP-amp. The latch circuit 330 can be an RS flip-flop. The output signal of the first comparator 310 is received in the S input terminal of the latch circuit 330, and the output signal of the second comparator 320 is received in the R input terminal of the latch circuit 330. The output signal Vo of the oscillation circuit 300 is applied to the Q output terminal of the latch circuit 300. The output signal Vo is fed back to the feedback switching circuit 400.

The feedback switching circuit 400 includes a first MOS transistor M1 and a second MOS transistor M2 to control a current path according to the charging- or discharging-operation of the capacitor CT. The first MOS transistor M1 can be a P-channel type, and the second MOS transistor M2 can be an N-channel type. A source terminal of the first MOS transistor M1 is connected to the second output terminal OUT2 of the first active current mirror 210, a drain terminal of the first MOS transistor M2 is connected to a drain terminal of the second MOS transistor M2, and a gate terminal of the first MOS transistor M1 receives the output signal Vo of the oscillation circuit 300.

A drain terminal of the second MOS transistor M2 is connected to the drain terminal of the first MOS transistor M1, a source terminal of the second MOS transistor M2 is connected to the output terminal OUT of the second active current mirror 220, and a gate terminal of the second MOS transistor M2 receives the output signal Vo of the oscillation circuit 300.

The divider 500 includes a first D-flip-flop 510 and a second D-flip-flop 520. The D input terminal of the first D-flip-flop 510 is connected to a $\overline{Q}$ output terminal of the first D-flip-flop 510, and a clock terminal of the first D-flip-flop 510 receives the output signal Vo of the oscillation circuit 300. The Q output terminal of the first D-flip-flop 510 generates the output clock signal CLK1. The D input terminal of the second D-flip-flop 520 is connected to a $\overline{Q}$ output terminal of the second D-flip-flop 520, and a clock terminal of the second D-flip-flop 520 connected to the Q output terminal of the first D-flip-flop 510 receives the output clock signal CLK1. The Q output terminal of the second D-flip-flop 520 generates the output clock signal CLK2.

Figure 8:
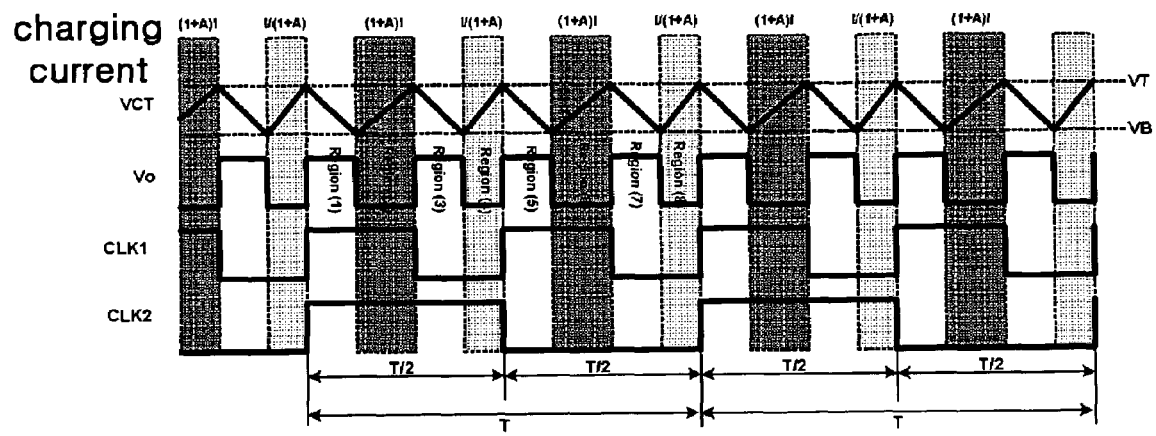
FIG. 8 is a waveform diagram illustrating operations of the RC oscillator IC of FIG. 7 according to the present invention.

FIG. 8 is a waveform diagram illustrating the operation of the RC oscillator IC of FIG. 7. In an ideal case, the value of the current signal IRT equals VREF/RT, and the values of the current signals I1, I2, and I3 are equal to each other, as represented by the following equation 6:

$$I1 = I2 = I3 = \frac{IRT}{N} = I \quad \text{[Equation 6]}$$

However, in real circuits, the current signal I1 includes a mismatch component, as described in Equations 3 and 4, related to the output clock signal CLK1 of the Q output terminal of the first D-flip-flop 510.

In more detail, if the output clock signal CLK1 assumes a logic high level, the current signal I1 is (1+A)I. If the output clock signal CLK1 assumes a logic low level, the current signal I1 becomes I/(1+A).

The output signal Vo of the oscillation circuit 300 assumes a high level in a first time region "Region (1)". The capacitor CT is discharged in Region (1), such that the voltage VCT is gradually decreased. When the capacitor-voltage VCT becomes equal to the reference voltage VB, the latch circuit 330 is reset, such that the output signal Vo assumes a low level.

Next, since the output clock signal CLK1 of the first D-flip-flop 510 assumes a high level in a second region ("Region (2)"), the capacitor CT is charged until the charging current I1 reaches the value of (1+A)I. The capacitor-voltage VCT gradually increases in this Region (2). When the capacitor-voltage VCT becomes equal to the threshold voltage VT, the latch circuit 330 is set so that the output signal Vo assumes a high level.

Since the output signal Vo is changed from low to high, the output clock signal CLK1 of the first D-flip-flop 410 is changed from high to low. Thereafter, the output signal Vo assumes a high level in a third region ("Region (3)"), such that the capacitor CT is discharged again to the current signal I. When the capacitor-voltage VCT becomes equal to the reference voltage VB, the output signal Vo again becomes high.

Subsequently, the output clock signal CLK1 becomes low in a fourth region ("Region (4)") and the capacitor CT is charged until the charging current I1 reaches the value of 1/(1+A). The output signal Vo assumes a high level when the capacitor-voltage VCT reaches the threshold voltage VT, such that the output clock signal CLK1 of the first D-flip-flop 510 becomes high again.

The above-mentioned operations are repeated in the remaining Region (5)-Region (8). Performing the operations of Region (1) to Region (8) generates the output clock signal CLK2 of the second D-flip-flop 520, resulting in an oscillation wave signal of a single completed period T. In this case, during a half period T/2, the charging current of the capacitor CT reaches the value of (1+A)I once, and reaches the value of 1/(1+A) once, such that a period T can be represented by the following Equation 7:

$$T = \frac{2[(1+A)I + I/(1+A) + 2I]}{CT}(VT - VB) \quad \text{[Equation 7]}$$

Equation 7 can be approximated by Equation 8:

$$T \approx \frac{2\left[1 + A + 1 - A + \frac{A^2}{2} + 2\right]I}{CT}(VT - VB) \quad \text{[Equation 8]}$$

$$= \frac{4\left(1 + \frac{A^2}{8}\right)I}{CT}(VT - VB)$$

As can be seen from Equation 8, the mismatch A appears squared, such that its effect is essentially negligible. In the above reasoning the current signal I2 for discharging the capacitor CT was assumed to be constant. However, in related implementations, where I2 is not entirely constant, the mismatch component A can be made to appear only in a squared form similar to Equation 8.

By using the described active current mirror of the RC oscillator IC, a user can achieve the desired result having superior frequency distribution characteristics with a small-sized capacitor, and there is no need to use a precise clock signal with a 50% duty to implement the active current mirror. Also, the user can generate an output signal with a 50% duty irrespective of operations of the active current mirror.

Figure 9:
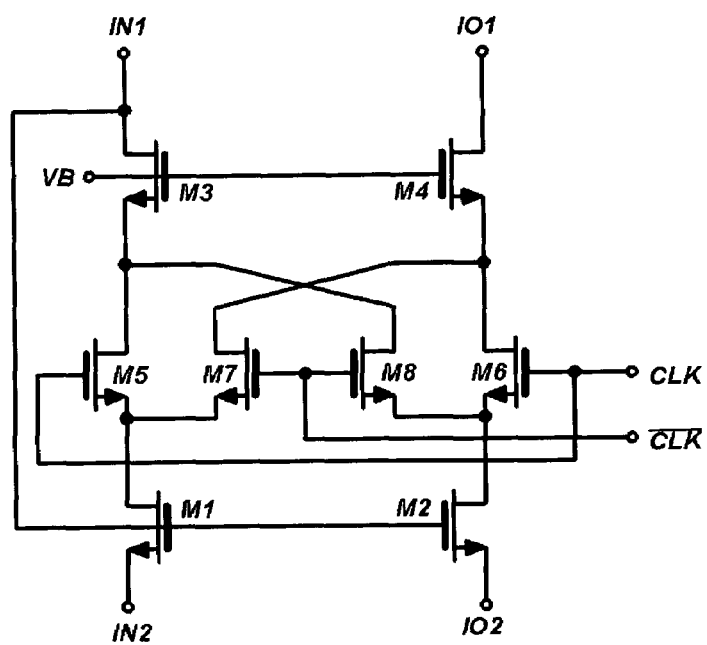
FIG. 9 is a circuit diagram illustrating an example of an NMOS-type active current mirror of FIG. 7 according to the present invention.

FIG. 9 is a circuit diagram illustrating an example of an NMOS-type active current mirror of FIG. 7. The active current mirror can be implemented with N-channel MOS transistors (NMOS transistors). In this implementation the active current mirror includes NMOS transistors M1 and M2, acting as a current-mirror, transistors M5, M6, M7, and M8 for changing the directions of current signals of the NMOS transistors M1 and M2, and transistors M3 and M4 arranged in the form of a cascade so that there is little variation in the output voltage of the first output terminal IO1. In this implementation, the reference voltage VB acts as a terminal for applying a bias voltage to the transistors M3 and M4.

Figure 10:
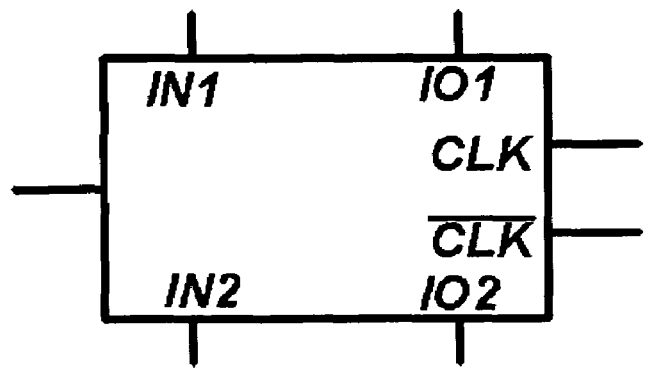
FIG. 10 is a circuit diagram illustrating a symbol of the active current mirror of FIG. 9 according to the present invention.

FIG. 10 is a circuit diagram symbolically illustrating the active current mirror of FIG. 9.

Figure 11:
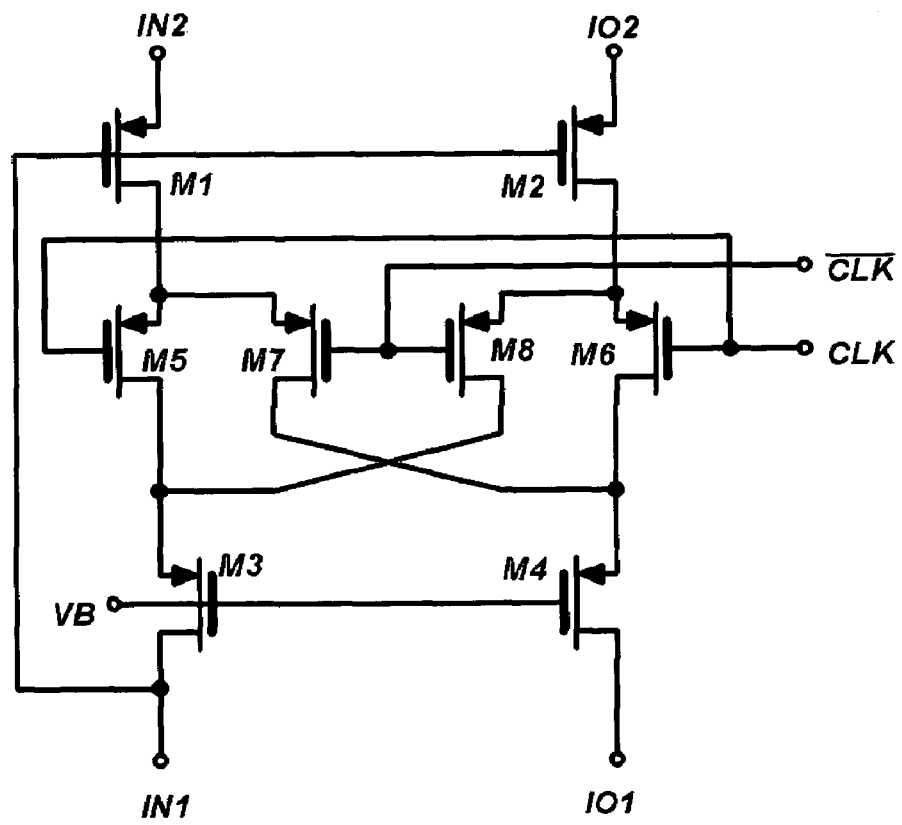
FIG. 11 is a circuit diagram illustrating another example of a PMOS-type active current mirror of FIG. 7 according to the present invention.

FIG. 11 is a circuit diagram illustrating another example of a PMOS-type active current mirror of FIG. 7. The active current mirror can include P-channel MOS transistors M1 and M2 instead of the N-channel MOS transistors. The basic operations of the active current mirror shown in FIG. 11 are analogous to those of FIG. 9.

Figure 12:
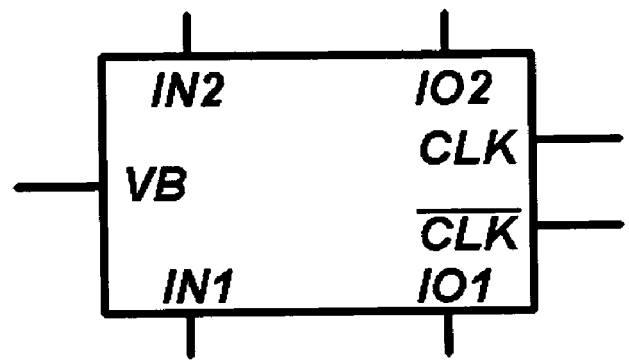
FIG. 12 is a circuit diagram illustrating a symbol of the active current mirror of FIG. 11 according to the present invention.

FIG. 12 is a circuit diagram symbolically illustrating the active current mirror of FIG. 11.

Figure 13:
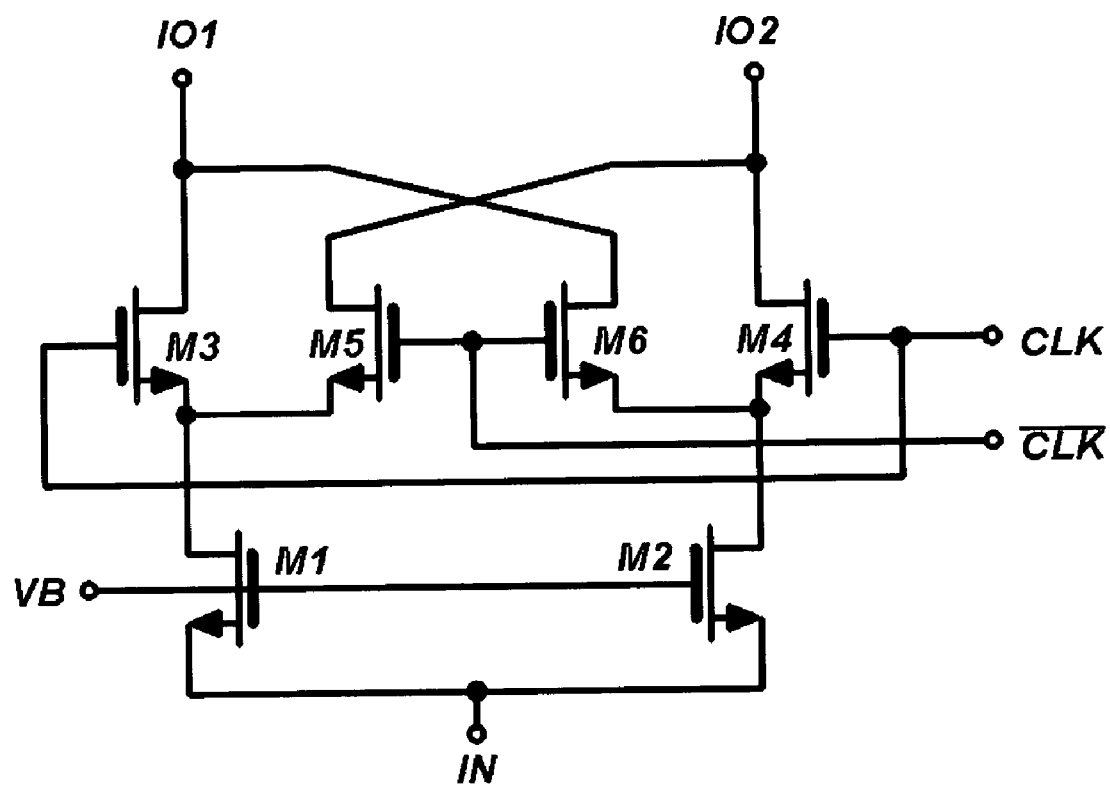
FIG. 13 is a circuit diagram illustrating an example of an NMOS-type active current division-2 circuit according to the present invention.

FIG. 13 is a circuit diagram illustrating an example of an NMOS-type active current division-2 circuit. The NMOS-type active current division-2 circuit includes a ½ divider, such that it can divide the input current IN into two $$\frac{1}{2}$$

IN signals. For the above-mentioned ½ division of the input current IN, source terminals of the NMOS transistors M1 and M2 can be connected to the input terminal IN in common.

Figure 14:
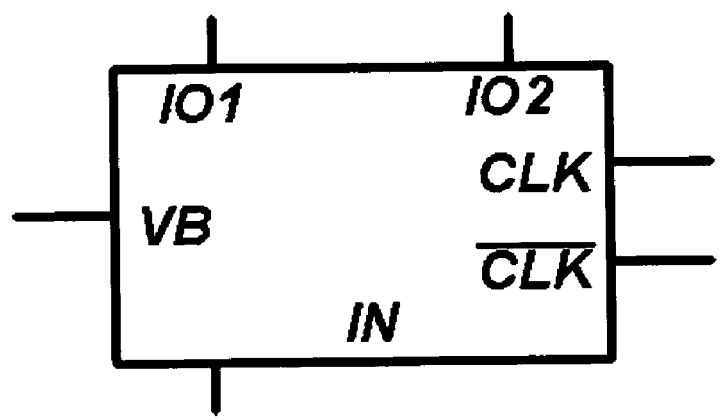
FIG. 14 is a circuit diagram illustrating a symbol of the circuit of FIG. 13 according to the present invention.

FIG. 14 is a circuit diagram symbolically illustrating the circuit of FIG. 13.

Figure 15:
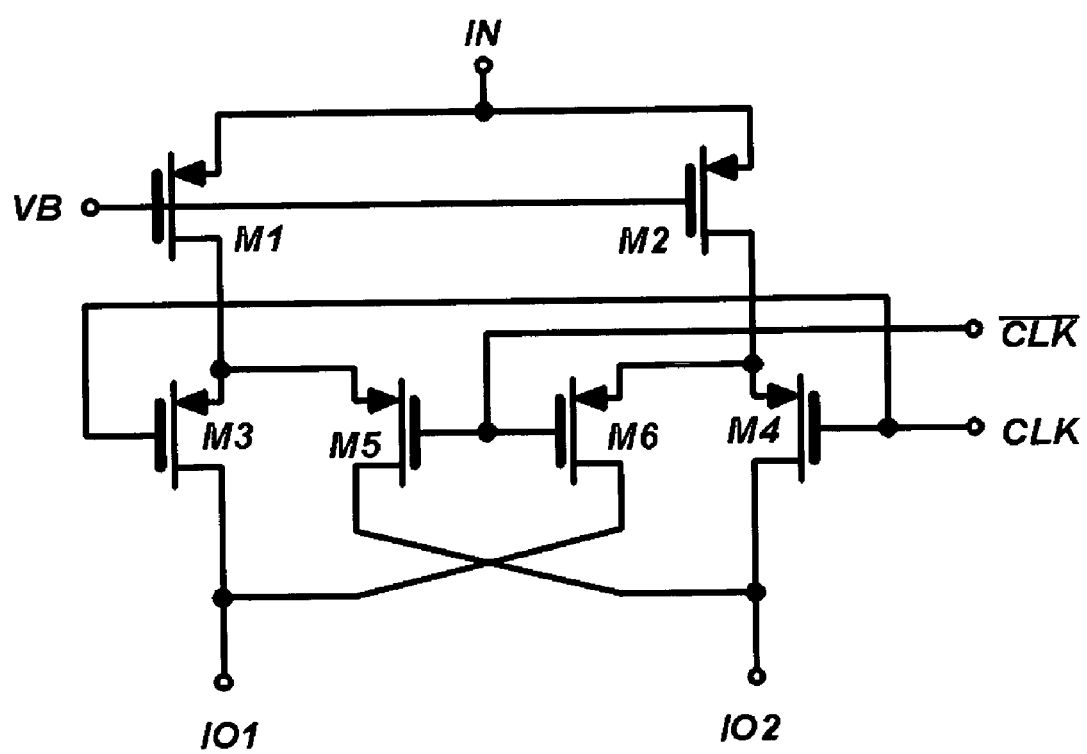
FIG. 15 is a circuit diagram illustrating an example of a PMOS-type active current division-2 circuit according to the present invention.

FIG. 15 is a circuit diagram illustrating an example of a PMOS-type active current division-2 circuit according to the present invention. The PMOS-type active current division-2 circuit includes P-channel MOS transistors M1 and M2 instead of N-channel MOS transistors. The basic operations of the active current mirrors shown in FIG. 15 are analogous to those of FIG. 13.

Figure 16:
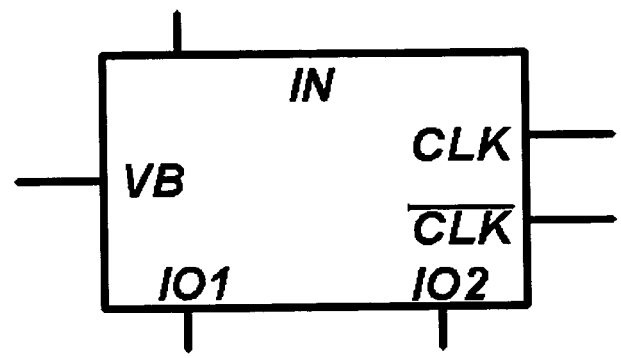
FIG. 16 is a circuit diagram illustrating a symbol of the circuit of FIG. 15 according to the present invention.

FIG. 16 is a circuit diagram symbolically illustrating the circuit of FIG. 15.

Figure 17:
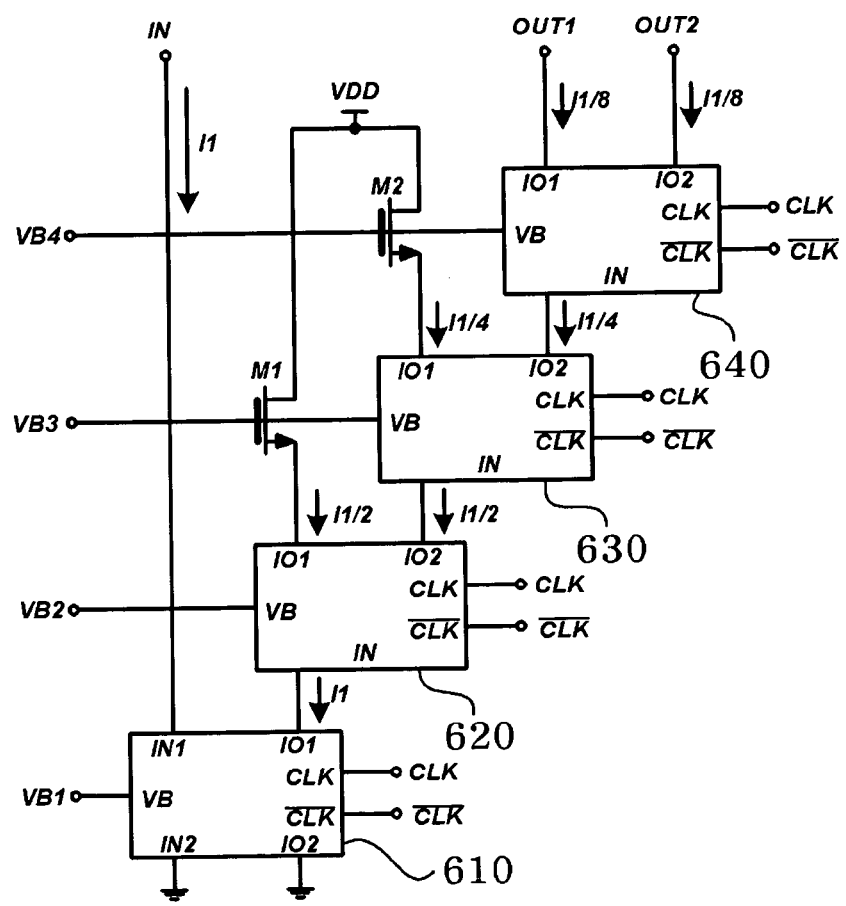
FIG. 17 is a circuit diagram illustrating an example of a division-8 circuit implemented by the active current mirror of FIG. 9 and the active current division-2 circuit of FIG. 13 according to the present invention.

FIG. 17 is a circuit diagram illustrating an example of a division-8 circuit implemented by the active current mirror of FIG. 9 and the active current division-2 circuit of FIG. 13. The division-8 circuit may include a current mirror 610 equipped with NMOS transistors, a first active current division-2 circuit 620 equipped with NMOS transistors, a second active current division-2 circuit 630 equipped with NMOS transistors, and a third active current division-2 circuit 640 equipped with NMOS transistors.

In more detail, the input current I1 is received at the first input terminal IN1 of the current mirror 610, the first output terminal IO1 is connected to the input terminal IN of the first active current division-2 circuit 620, and the second input terminal IN2 and the second output terminal IO2 are grounded. The first reference voltage VB1 is received at the reference-voltage input terminal VB of the current mirror 610, a positive clock signal CLK is received at a first clock input terminal CLK, and a negative clock signal $\overline{CLK}$ is received at a second clock input terminal $\overline{CLK}$.

A common input terminal IN of the first active current division-2 circuit 620 is connected to the first output terminal IO1 of the current mirror 610. The first output terminal IO1 is connected to the source terminal of the first MOS transistor M1, and the second output terminal IO2 is connected to the common input terminal IN of the second active current division-2 circuit 630. The second reference voltage VB2 is applied to the reference-voltage input terminal VB. The current signal $$\frac{1}{2}$$

I flows at the first output terminal IO1 of the first active current division-2 circuit 620, and the remaining current signal $$\frac{1}{2}$$

I flows at the second output terminal IO2 of the first active current division-2 circuit 620.

The common input terminal IN of the second active current division-2 circuit 630 is connected to the second output terminal IO2 of the first active current division-2 circuit 620, the first output terminal IO1 of the second active current division-2 circuit 630 is connected to the source terminal of the second MOS transistor M2, and the second output terminal IO2 of the second active current division-2 circuit 630 is connected to the common input terminal IN of the third active current division-2 circuit 640. The third reference voltage VB3 is applied to the reference-voltage input terminal VB. The current signal $$\frac{1}{4}$$

I flows at the first output terminal IO1 of the second active current division-2 circuit 630, and the remaining current signal $$\frac{1}{4}$$

I flows at the second output terminal (IO2) of the second active current division-2 circuit 630.

The common input terminal IN of the third active current division-2 circuit 640 is connected to the second output terminal IO2 of the second active current division-2 circuit 630, the first output terminal IO1 of the third active current division-2 circuit 640 acts as the first output terminal OUT1 of the active current mirror 210, and the second output terminal IO2 of the third active current division-2 circuit 640 acts as the second output terminal OUT2 of the active current mirror 210. The fourth reference voltage VB4 is received at the reference-voltage input terminal VB. The current signal $$\frac{1}{8}$$

I flows at the first output terminal IO1 of the third active current division-2 circuit 640, and the remaining current signal $$\frac{1}{8}$$

I flows at the second output terminal IO2 of the third active current division-2 circuit 640.

Although specific embodiments of the present invention have been disclosed for illustrative purposes, those skilled in the art will appreciate that various modifications, additions and substitutions are possible, without departing from the scope and spirit of the invention, which is limited only by the accompanying claims.

What is claimed is:

1. A RC oscillator integrated circuit (IC) comprising:
   an active current mirror connected to an external resistor, for receiving a current signal corresponding to a voltage signal applied to the external resistor, performing 1/N-times division of the received current signal according to an input clock signal, and generating a 1/N-times current signal;
   an oscillation circuit for generating an output voltage corresponding to a charging- or discharging-operation of a capacitor via a current path formed by the active current mirror;
   a feedback switching circuit for controlling a charging- or discharging-path of the capacitor by a feedback of an output signal Vo of the oscillation circuit; and
   a divider for generating a first clock signal capable of driving the active current mirror according to the output signal of the oscillation circuit, and a second output clock signal having a compensated mismatch of the active current mirror.

2. The RC oscillator integrated circuit IC according to claim 1, wherein the oscillation circuit comprises:
- a first comparator for receiving a voltage of the capacitor at its positive input terminal, and receiving a threshold voltage at its negative input terminal;
- a second comparator for receiving a reference voltage at its positive terminal, and receiving the capacitor voltage at its negative terminal; and
- an RS flip-flop for receiving an output signal of the first comparator at its S input terminal, and receiving an output signal of the second comparator at its R input terminal.

3. The RC oscillator integrated circuit (IC) according to claim 1, wherein the feedback switching circuit comprises:
- a first MOS transistor for receiving the output signal of the oscillation circuit at its gate terminal, connecting its drain terminal to the active current mirror, and receiving the capacitor voltage at its source terminal; and
- a second MOS transistor for receiving the output signal of the oscillation at its gate terminal, receiving the capacitor voltage at its drain terminal, and connecting its source terminal to the active current mirror.

4. The RC oscillator integrated circuit (IC) according to claim 3, wherein the active current mirror comprises:
- a first active current mirror including: an input terminal for receiving a current signal corresponding to the voltage applied to the external resistor; a first output terminal; and a second output terminal connected to the drain terminal of the first MOS transistor; and
- a second active current mirror including: an input terminal connected to the first output terminal of the first active current mirror; and an output terminal connected to the source terminal of the second MOS transistor.

5. The RC oscillator integrated circuit (IC) according to claim 4, wherein the first active current mirror includes:
- a first current mirror; and
- a second current mirror for receiving an output current signal of the first current mirror, and generating the received current signal according to the input clock signal.

6. The RC oscillator integrated circuit (IC) according to claim 5, wherein the second current mirror includes a plurality of second current mirror units arranged in the form of a cascade in which output terminals of front current mirror units are connected to input terminals of rear current mirror units, whereby
- if the number of the second current mirror units is N, the second current mirror outputs a $\frac{1}{2}N$-times divided current.

7. The RC oscillator integrated circuit (IC) according to claim 1, wherein the divider includes:
- a first D-flip-flop for receiving the output signal of the oscillation circuit as its clock signal, and receiving a clock signal generated from its Q output terminal via its D input terminal; and
- a second D-flip-flop for receiving the clock signal generated from the Q output terminal of the first D-flip-flop as a clock signal, and receiving the clock signal generated from its Q output terminal via its D input terminal, whereby
- the clock signal generated from the first D-flip-flop is used as the clock signal for operating the active current mirror.

* * * * *